United States Patent [19]

Stark

[11] 4,287,570
[45] Sep. 1, 1981

[54] MULTIPLE BIT READ-ONLY MEMORY CELL AND ITS SENSE AMPLIFIER

[75] Inventor: Moshe Stark, Haifa, Israel

[73] Assignee: Intel Corporation, Santa Clara, Calif.

[21] Appl. No.: 44,762

[22] Filed: Jun. 1, 1979

[51] Int. Cl.³ .................... G11C 17/00; G11C 7/06
[52] U.S. Cl. .................................. 365/104; 365/189
[58] Field of Search ............... 365/45, 103, 104, 168, 365/182, 184, 149, 189

[56] References Cited

U.S. PATENT DOCUMENTS

| | | | |
|---|---|---|---|
| 3,390,381 | 6/1968 | Shepard | 365/149 |
| 3,656,117 | 4/1972 | Maley et al. | 365/168 |
| 4,192,014 | 3/1980 | Craycraft | 365/104 |

Primary Examiner—Stuart N. Hecker
Attorney, Agent, or Firm—Blakely, Sokoloff, Taylor & Zafman

[57] ABSTRACT

The bit density of stored information in a read-only memory (ROM) can be substantially increased by increasing the number of bits which can be stored in each memory cell. This can be accomplished without increasing the size or complexity of the memory cell by having the read only memory capacity stored in each memory cell as one of a multiple number of discrete states achievable by the cell. In a semiconductor chip this can be accomplished by having the semiconductor element, such as a transistor, capable of assuming one of a multiple of parametric values or states. For example, as described herein, impedance or cell width of a semiconductor transistor can be varied to assume one of four different states. The state assigned to a selected memory cell is bracketed by the value of the outputs of a plurality of comparator circuits coupled thereto. The outputs of the comparator circuits are then analyzed by a logic circuit to provide the appropriate binary readout representative of the parametric state of the selected cell.

1 Claim, 4 Drawing Figures

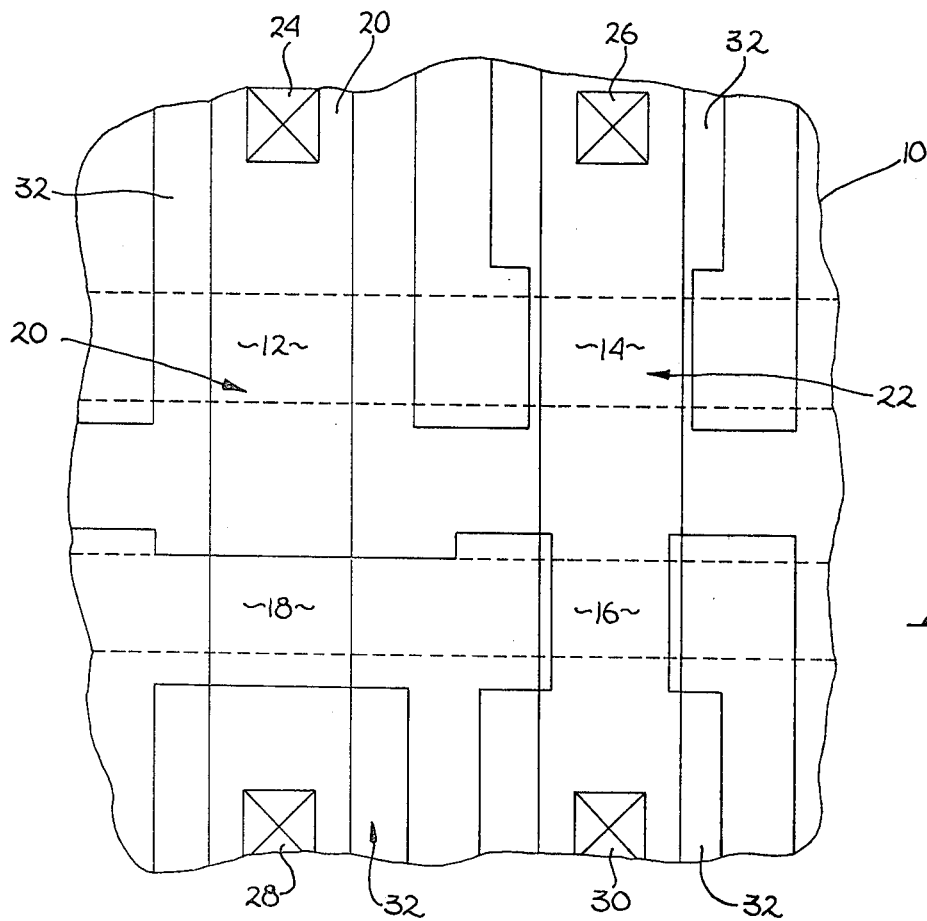
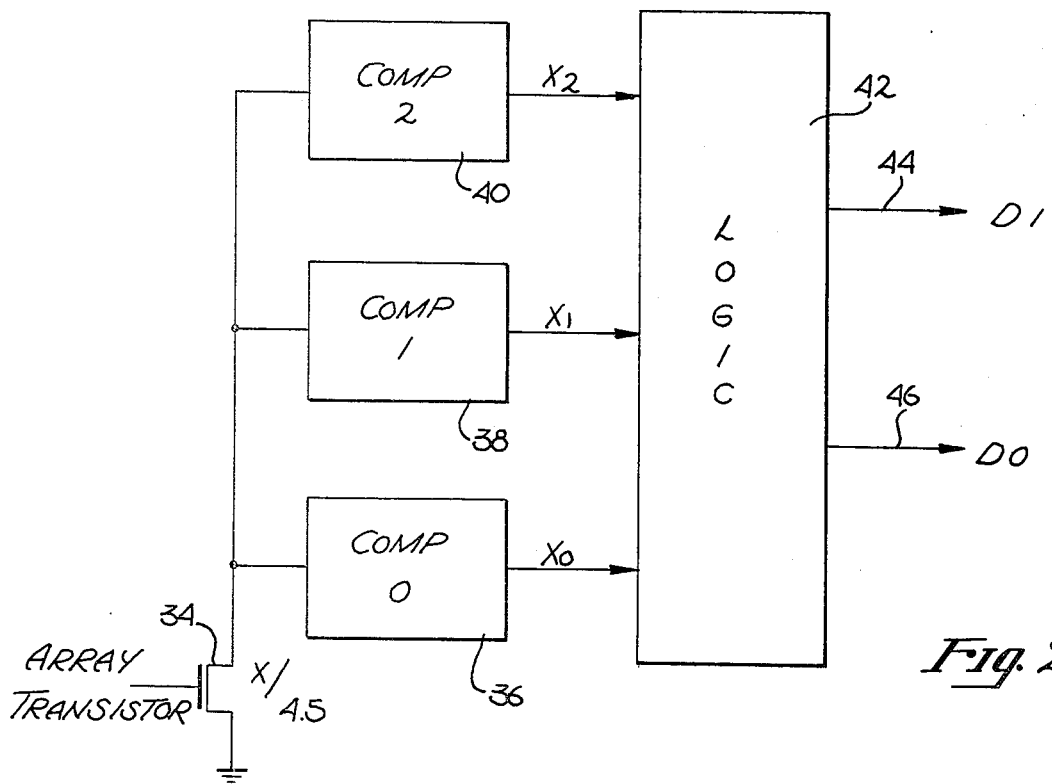

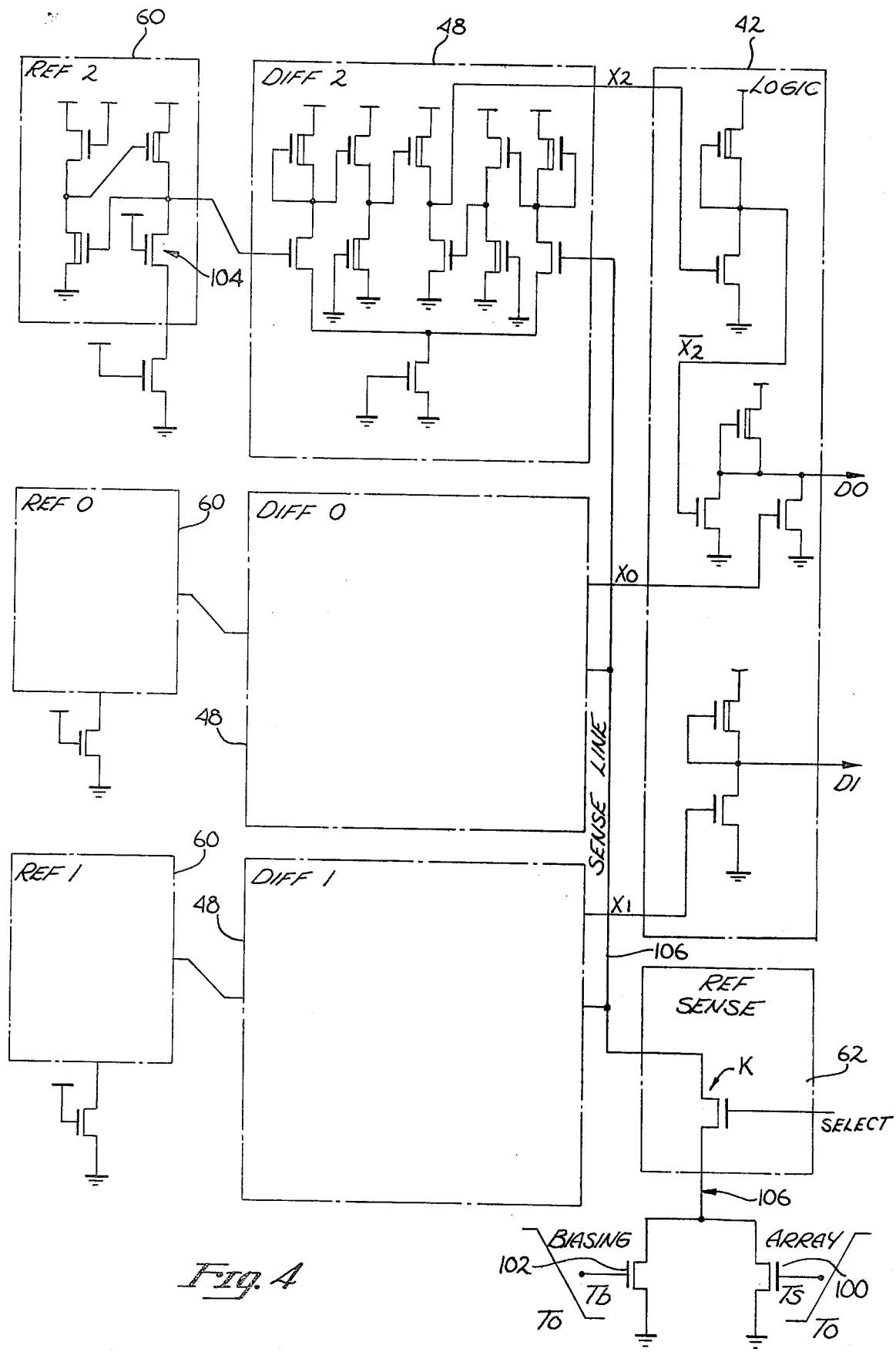

MULTIPLE BIT READ-ONLY MEMORY CELL AND ITS SENSE AMPLIFIER

BACKGROUND OF THE INVENTION

1. Field of the Invention

The present invention is in the field of read-only memories and in particular in semiconductor read-only memories wherein each memory cell has the capability of storing more than one bit of binary information.

2. Prior Art

One of the largest components of a digital computer system is the memory banks. Although substantial improvements have been made in computer memories, the size, speed and storage capacity of memories tend to limit computer systems, particularly mini- and microcomputer systems which are typically required for small-scale and on-site applications.

Present technology has continued to improve the storage capacity of semiconductor memories principally by reducing the device or memory cell size on the semiconductor chip. However, the device and memory cell sizes have decreased on semiconductor chips to the point of the practical and physical limitations of micro-photolithographic techniques. Therefore what is needed is a semiconductor memory which can be designed within the drafting rules and practical limitations of micro-photolithography and whereby digital information density can be substantially increased in a semiconductor memory chip.

BRIEF SUMMARY OF THE INVENTION

The present invention is a memory circuit which comprises a circuit device having a characteristic performance parameter, such as impedance or cell width, wherein the performance parameter assumes a selected one of a discrete plurality of possible values. A comparator means or circuit is coupled to the circuit device for comparing the selected value of the performance parameter assumed by the circuit device against at least one predetermined value. A logic means or circuit is also coupled to the comparator means for decoding the output of the comparator means and generating a number, which has a maximum magnitude equal to the discrete plurality of the values possible for the performance parameter of the circuit device. By this means a memory circuit can be devised which has more than two states for each memory cell. In particular, as discussed in the Detail Description of the Preferred Embodiment, a circuit can be devised which has four states for each memory cell.

It is within the contemplation of the present invention that circuit devices includes semiconductor devices or transistors and that the performance parameter is impedance. Specifically, the circuit device may be a field effect transistor wherein the performance parameter is characterized as a source-to-drain width of the field effect transistor (FET).

The comparator means includes a differential amplifier used to compare the value of the performance parameter of the selected device against a predetermined value. The comparator means or circuit has a plurality of outputs which number one less than the discrete values possible for the circuit device. In other words, if the circuit device can assume four possible states of impedance the outputs of the comparator will number three. Each output of the comparator corresponds to a predetermined value, and each of these predetermined values is numerically nested or bracketed between the numerical values of two of the discrete plurality of values possible for the performance parameter of the circuit device. For example, if the performance parameters of the circuit device are symbolically characterized assuming the states, one, two, three, and four, the outputs of the comparator correspond to the values such as, 1.5, 2.5 and 3.5.

The present invention can also be characterized as a method of reading a multiple bit binary number from a memory circuit comprising the steps of selectively accessing the memory cell wherein the memory cell includes a circuit device having a characterizing parameter. The parameter is selectively fixed at one of the discrete plurality values. The selectively fixed value of the parameter of the circuit element is then compared to the discrete plurality of reference values. A plurality of output comparison signals is then generated wherein each corresponds to a comparison of the selectively fixed value of the circuit or element parameter to each one of the reference values. The output comparison signals which are generated are then coded to generate a multiple bit binary number. By this method a multiple bit binary number can be read from a single circuit element which has the capability of assuming one of the discrete plurality of parametric values. Again, this method is practiced by the present invention wherein the parameter which is measured is impedance and the steps of comparing the selectively fixed value and generating the plurality of output comparison signals is effected by a comparison means or circuit which includes a differential amplifier used to compare the selectively fixed value of the parameter of the circuit element against each of the reference values.

These and other aspects of the present invention can better be understood by reading the Detailed Description of the Preferred Embodiment in light of the following figures.

BRIEF DESCRIPTION OF THE DRAWINGS

FIG. 1 is a plan view of a portion of a semi-conductor chip showing four transistors having four separate discrete source-to-drain widths.

FIG. 2 is a block diagram showing the relationship of a comparator means or circuit to a selected transistor. The comparator means or circuit is illustrated as in communication with a logic means or circuit.

FIG. 4 is a schematic diagram, shown in greater detail in FIG. 3, of a complete circuit of the type as illustrated in FIG. 2.

DETAILED DESCRIPTION OF THE PREFERRED EMBODIMENTS

Figure 3:
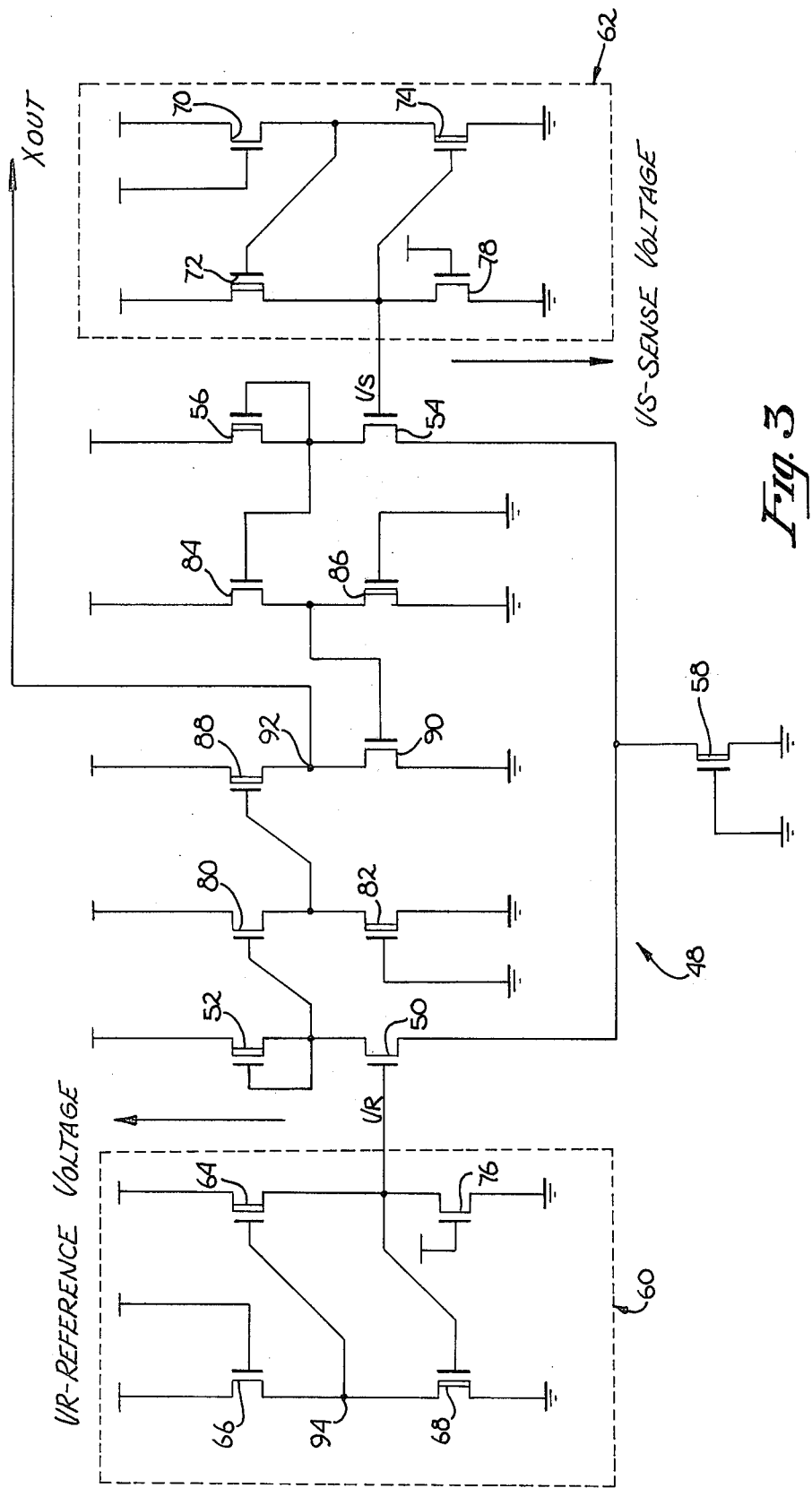
FIG. 3 is a schematic diagram of one of the comparator circuits of FIG. 2.

The present invention is a circuit and method for increasing the density of binary digital information which may be stored in a semiconductor, read only memory by virtue of using a plurality of parametric states achievable within an electrical device. Although the present scope of the invention is intended to include all known types of devices and all known characteristic parameters of such devices, for the sake of clarity and simplicity, the illustrated embodiment is discussed in terms of a field effect transistor having a variable source to drain width, and thus variable impedance states. Again, for the purposes of illustration, it is assumed that no more than four values or states of the impedance of an FET can be distinguished. However, it is contemplated that many more such impedance states can be distinguished in a single transistor. Thus, by the method of the present invention of reading or sensing the impedance of an FET with the circuitry of the present invention, a single transistor can be considered to store one of four values, or in other words, a two bit binary number. Where prior art semiconductor cells typically store only one bit per memory transistor, the present invention includes the capability of storing two or more bits per memory transistor.

FIG. 1 graphically illustrates a plan view of the deposition pattern on a semiconductor chip showing four transistors wherein each transistor assumes one of four different source drain widths and thus one of four different impedance values. Chip 10 includes transistors 12, 14, 16 and 18. Each of the transistors 12–18 are identical in every respect except for the source-to-drain width. For example, regions 20 and 22 are the area of the gate electrode having contact points 24, 26, 28 and 30. The source and drain diffusion regions are designated as regions 32. Thus, it can be seen in the illustration of FIG. 1 that transistor 18 has a source-to-drain width of 0 microns, transistor 16 a width of 5 microns, transistor 14 a width of 7.5 microns and transistor 12 the maximum width of 11 microns. The configuration and source-to-drain width are arbitrary and are given and shown only by way of example. Other variations or widths may be chosen or defined by means well known in the art consistent with the teachings of the present invention.

FIG. 2 illustrates, in simplified form, one circuit by which the objects of the present invention may be achieved. One of the memory transistors 12, 14, 16 or 18 is selectively coupled to a plurality of comparators. In FIG. 2, transistor 34, having a source-to-drain width of x by 4.5 microns, has its source or drain region coupled to comparators 36, 38 and 40. Comparators 36, 38 and 40 are similarly coupled to the inputs of logic circuit 42. Logic circuit 42 has two outputs 44 and 46 which are representative of a two bit binary number.

Each of the comparators 36, 38 and 40 compare the size of transistor 34 against an internal transistor in the comparator. As stated above, suppose that the variable parameter of the transistor 34 is a dimension of a source to drain width assuming one of the values 0, 5, 7.5 or 11 microns. Comparator circuit 36 can then be designed to distinguish between transistors having a source-to-drain width smaller or larger than 6 microns. That is, the output of comparator 36, $X_0$, is one (1) or true if transistor 34 has a parametric value of less than 5 microns and is otherwise zero (0) or false. For the sake of simplicity, positive logic will be used throughout the discussion of the illustrated embodiment.

Similarly, comparator 38 generates an output $x_1 = 1$ for transistors having a parametric value smaller than 6 and otherwise generates $x_1 = 0$; and comparator 40 similarly distinguishes between transistors smaller or larger than a parametric value of 9 microns. The signals, $x_0$, $x_1$, and $x_2$ are coupled to logic circuit 42 which then decodes, by logic means well known to the art, the $x_0$, $x_1$, and $x_2$ signals into a two digit binary member, $d_0$ and $d_1$. Table 1 below, illustrates a truth table for the comparator circuits and logic circuits.

TABLE I

| Transistor | $X_0$ | $X_1$ | $X_2$ | $D_1$ | $D_0$ |
|---|---|---|---|---|---|
| 0 | 1 | 1 | 1 | 0 | 0 |
| 5 | 0 | 1 | 1 | 0 | 1 |
| 7.5 | 0 | 0 | 1 | 1 | 1 |
| 11 | 0 | 0 | 0 | 1 | 0 |

Thus it can be seen, that from the four parametric values assumable by transistor 34, three comparators generate three comparison signals, $x_0$, $x_1$ and $x_2$ which are then decoded by logic to a two bit binary number representative of the information stored within transistor 34. The above Table can be summarized by two Boolean equations, namely:

$$d_1 = \bar{x}_1 \tag{1}$$

$$d_0 = \overline{x_0 + \bar{x}_2} \tag{2}$$

Clearly, these two Boolean equations completely describe circuitry required in logic means 42.

It should be kept in mind that transistor 34 is characterized by parametric values which are of an analog nature and which must be converted to a digital level by the comparators. As is typical with analog signals, care must be taken to ignore or nullify irrelevant influences on the comparator circuit. FIG. 3 illustrates one such circuit. FIG. 3 shows a differential amplifier 48 which is both balanced geometrically and electrically. Changes in temperature, voltage, critical dimensions and processing variations are thus necessarily self-balancing. Differential amplifier 48 is comprised in essence of transistors 50, 52, 54, 56 and 58. Circuit 60 provides a reference voltage VR on the gate of transistor 50 while circuit 62 similarly provides a sense VS on the gate of transistor 54. Reference circuit 60 of the present invention is described in greater detail in U.S. Pat. No. 4,100,437 assigned to Intel Corporation. Transistors 64, 66 and 68 of circuit 60 are designed to be identical to transistors 70, 72 and 74 respectively of circuit 62. Transistor 76 is a reference transistor specifically designed into each comparator while transistor 78 is the selected memory cell transistor in which the information is stored. Thus, the difference between the reference voltage VR and the sense voltage VS is entirely dependent upon the relative impedance of reference transistor 76 and memory transistor 78. The remaining transistors in circuits 60 and 62 form identical biasing networks.

The difference between VR and VS is then amplified by the differential amplifier and used as an input to a single input-output amplifier. Follower transistors 80, 82, 84 and 86 are coupled to the inverter formed by transistors 50, 52 and 54, 46 respectively in order to bias the amplifier, which is comprised of transistors 88 and 90, to the point of maximum amplification.

For example, if the impedance of the sense transistors 78 is greater than the impedance of the reference transistor 76, the voltage VS will be greater than VR. Transistor 50 will then be turned on harder than transistor 54 thereby dropping the potential on the gate transistor 84 lower than the potential applied to the gate of transistor 80. As a result, potential on the gate of transistor 90 will be lower than the potential applied to the gate of transistor 88. Thus, the output voltage at node 92 will be high or will assume a true logic level. Since the circuit is entirely symmetrical, it is clear that if the impedance of device 78 were lower than that of device 76, the potential at node 82 would be low or a false logic level.

It should be noted that circuit 60 and 62 also incorporate a negative feedback to stabilize the VR and VS levels despite variations in the voltage supply, temperature and file variations. For example, if the voltage supply should rise, VR would also tend to rise. But as VR rises, device 68 begins to turn on. As device 68 begins to turn on, the potential at node 94 begins to decrease, also causing device 64 to turn off. As device 64 begins to turn off, the voltage VR tends to decrease.

Since the sense and reference voltages only are coupled to the gates of the differential amplifier and nowhere else, the comparators that sense the reference and memory transistors are completely decoupled. Therefore, the comparator circuits of FIGS. 2 and 4 can be separately tuned one from the other. In addition, since the reference voltage source, circuit 60, and the memory cell voltage source, 62, couple only to the gates of the differential amplifier and are in no way loaded or required to supply high current needs, only three reference circuits 60 and four sense voltage circuits 62 are required for a read only memory having eight binary data outputs.

FIG. 4 shows in greater detail a practical circuit of the type shown in FIG. 2 using the comparator of the type as discussed with respect to FIG. 3. Device 100 represents a memory transistor selected from the memory array. A biasing transistor 102 provides an initial bias level of array column line 106 at a voltage level half way between the highest and lowest voltages assumable for the sensed memory transistor 100. It is needed only to shorten the sensing time. As shown by the waveforms next to the gates of transistors 102 and 100, transistor 102 is disconnected when transistor 100 is sensed and vice-versa. Transistor 104 is added to reference voltage circuits 60, in order to compensate for transistor K (see FIG. 4) which is coupled to array column line 106. Transistors K and 100, in combination, replace transistor 78 of FIG. 3 in sense circuit 62. Otherwise, circuits 60 and 62 of FIG. 4 are identical to those shown in FIG. 3. Circuit 60 is replicated in reference circuits REF. 0, REF. 1 and REF. 2 which are coupled to differential amplifiers 48, DIFF. 0, DIFF. 1 and DIFF. 2, respectively, and which as depicted in FIG. 4 are identical to the differential amplifier discussed in FIG. 3. The outputs of differential amplifiers DIFF. 0, DIFF. 1 and DIFF. 2 are, respectively, the output signals $x_0$, $x_1$ and $x_2$ discussed in FIG. 2. Logic circuit 42 is expressly depicted in FIG. 4 for the well-known implementation of the Boolean equations set forth above: namely, $x_1$ is coupled to an inverter to generate $D_1$; and $D_0$ is the output of a two input NOR gate having $x_0$ and the inverted value of $x_2$ as inputs.

It has been observed that the illustrated memory of sense circuit for the two-bit per cell programmed ROM works without level problems even in extreme and non-realistic conditions. By use of the present invention, a significant size reduction is achieved. For example, in single chip microprocessors, if 30% of the die size is dedicated to programmable logic arrays and micro-program ROMs, the reduction in total die size in the microprocessor can be expected to be approximately 15%. In addition, by use of the present invention it should be possible to design a 32,000 bit ROM using multiplexed address and data lines in a 16 pin package. The present invention allows a 32,000 bit ROM to be designed into a 16 pin package 155 mils wide without difficulty. Thus, without any improvement of existing micro-photolithographic technology, the bit density in a ROM can be doubled.

Again, it is within the scope of the present invention that even greater density intensification can be achieved by sensing more than four separate impedance or width values in a transistor or by using other parametric characteristics of a transistor or other parametric characteristics of other types of devices. The above discussion is set forth only for the purposes of illustration. It is not intended to limit or restrict the scope and nature of the present invention as set forth in the claims.

I claim:

1. A memory circuit comprising:
   characterizing source-to-drain width assuming a selected one of a discrete plurality of values;
   comparator means coupled to said circuit device for comparing said selected one value of said width of said transistor against at least one predetermined value; and
   logic means coupled to said comparator means for decoding the output of said comparator means into a number, said number having maximum magnitude equal to said discrete plurality of values of said width of said transistor, wherein said comparator means has a plurality of outputs one less in number than said discrete plurality of values of said transistor wherein each said output corresponds to a predetermined value, each said predetermined value being nested between two of said discrete plurality of values of said width of said transistor; and
   wherein said comparator means includes a differential amplifier to compare said selected one of said discrete plurality of values of said width of said transistor against said predetermined value wherein said sense amplifier is comprised of a biased reference inverter, a biased sense inverter, a reference voltage source, a sense voltage source coupled to said field effect transistor, and an output amplifier, said sense voltage and reference voltage sources being substantially identical in circuit design and coupled to said biased inverters, said sense inverter coupled to said sense voltage source and said reference inverter coupled to said reference voltage source, said sense and reference inverters being coupled to the inputs of said output amplifier whereby analog voltages are analyzed by said comparator means to reliably produce digital voltage levels independent and self-compensating for changes in temperature, voltage, dimension and process variations;
   whereby a memory circuit may be devised having more than two states for each memory cell.

* * * * *